United States Patent
Malek et al.

(10) Patent No.: US 9,192,046 B2
(45) Date of Patent: Nov. 17, 2015

(54) COMPONENT MOUNTING STRUCTURE WITH FLEXIBLE JUMPER

(71) Applicant: Apple Inc., Cupertino, CA (US)

(72) Inventors: Shayan Malek, San Jose, CA (US); Gregory N. Stephens, Sunnyvale, CA (US); Michael B. Wittenberg, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 153 days.

(21) Appl. No.: 13/679,939

(22) Filed: Nov. 16, 2012

(65) Prior Publication Data

US 2014/0140021 A1 May 22, 2014

(51) Int. Cl.

| | |
|---|---|
| H05K 1/02 | (2006.01) |
| H05K 1/11 | (2006.01) |
| H04M 1/02 | (2006.01) |
| H05K 1/18 | (2006.01) |
| H05K 3/36 | (2006.01) |
| G06F 1/16 | (2006.01) |
| H04R 11/02 | (2006.01) |
| H05K 1/14 | (2006.01) |
| H05K 3/32 | (2006.01) |

(52) U.S. Cl.
CPC .............. *H05K 1/118* (2013.01); *G06F 1/1658* (2013.01); *H04M 1/026* (2013.01); *H04R 11/02* (2013.01); *H05K 1/189* (2013.01); *H05K 3/361* (2013.01); *H04R 2499/11* (2013.01); *H05K 1/0281* (2013.01); *H05K 1/147* (2013.01); *H05K 3/325* (2013.01); *H05K 2201/10083* (2013.01); *H05K 2201/10409* (2013.01); *H05K 2201/2009* (2013.01)

(58) Field of Classification Search
CPC ...... H05K 1/02; H05K 1/0296; H05K 1/0277
USPC ........................................................ 361/751
See application file for complete search history.

(56) References Cited

U.S. PATENT DOCUMENTS

| | | | |
|---|---|---|---|
| 5,244,395 A | 9/1993 | DeSantis et al. | |
| 5,801,466 A * | 9/1998 | Odagiri et al. | 310/81 |
| 5,943,214 A * | 8/1999 | Sato et al. | 361/752 |

(Continued)

FOREIGN PATENT DOCUMENTS

| | | |
|---|---|---|
| GB | 2356914 | 6/2001 |
| JP | 2002015827 | 1/2002 |
| WO | 0055959 | 9/2000 |

*Primary Examiner* — Jenny L Wagner
*Assistant Examiner* — Michael P McFadden
(74) *Attorney, Agent, or Firm* — Treyz Law Group; G. Victor Treyz; Joseph F. Guihan

(57) ABSTRACT

An electronic device contains electrical components. An electrical component is mounted to an electronic device housing using mounting structures. The mounting structures include a flexible printed circuit jumper having opposing ends with metal contact pads. Metal traces in the flexible printed circuit jumper form contact traces within openings in a solder mask layer. Solder in the openings may be used to connect the metal contact pads to the contact traces. A metal bracket may be screwed into the electronic device housing to mount the electrical component to the electronic device housing. The metal bracket may press the metal contact pads on one end of the jumper against mating contact terminals on the electrical component and may press the metal contacts on the other end of the jumper against mating contact pads on an additional printed circuit.

14 Claims, 7 Drawing Sheets

(56) References Cited

U.S. PATENT DOCUMENTS

| | | |
|---|---|---|
| 7,234,945 B2 | 6/2007 | Azuma et al. |
| 7,253,365 B2 | 8/2007 | Crane, Jr. et al. |
| 7,408,786 B2 | 8/2008 | Lowles et al. |
| 8,243,457 B2 * | 8/2012 | Ihara ............... H05K 7/1417 361/751 |
| 2009/0247237 A1 * | 10/2009 | Mittleman et al. ............ 455/567 |
| 2009/0315689 A1 | 12/2009 | Peng |
| 2010/0110653 A1 | 5/2010 | Hisada |
| 2010/0271292 A1 | 10/2010 | Penttila et al. |
| 2011/0255850 A1 | 10/2011 | Dinh et al. |
| 2012/0176754 A1 * | 7/2012 | Merz ............... H01Q 1/243 361/751 |
| 2013/0107476 A1 * | 5/2013 | Wright et al. ............... 361/752 |
| 2013/0257659 A1 * | 10/2013 | Darnell et al. ............... 343/702 |

* cited by examiner

COMPONENT MOUNTING STRUCTURE WITH FLEXIBLE JUMPER

BACKGROUND

This relates generally to electronic devices and, more particularly, to electronic devices with components and component mounting structures.

Electronic devices include electrical components. Some electrical components such as integrated circuits can be mounted on printed circuit boards. Other electrical components such as vibrators serve more mechanical functions and may need to be mounted to sturdy support structures such as portions of a device housing.

Challenges arise when mounting electrical components in an electronic device. If care is not taken, electrical components may be inadequately secured within a device, which can make the device prone to mechanical failure. Components should also be mounted in a way that allows signals to be distributed to the component over reliable signal paths that are not excessively bulky.

It would therefore be desirable to be able to provide electronic devices with improved arrangements for mounting electronic components.

SUMMARY

An electronic device contains electrical components. An electrical component is mounted to an electronic device housing using mounting structures. The mounting structures include a flexible printed circuit jumper having opposing ends with metal contact pads. Metal traces in the flexible printed circuit jumper form contact structures within openings in a solder mask layer. Solder in the openings may be used to connect the metal contact pads to the contact structures. This type of arrangement may raise the metal contact pads above the solder mask layer to promote satisfactory formation of electrical connections with mating metal contacts.

A metal bracket may be screwed into the electronic device housing to mount the electrical component to the electronic device housing. The electrical component may be a component such as a vibrator. The vibrator or other electrical component may have contact terminals. The metal bracket may press the metal contact pads on one end of the jumper against the contact terminals on the electrical component. The metal bracket may also press the metal contacts on the other end of the jumper against mating contact pads on an additional printed circuit.

Further features, their nature and various advantages will be more apparent from the accompanying drawings and the following detailed description of the preferred embodiments.

DETAILED DESCRIPTION

Figure 1:
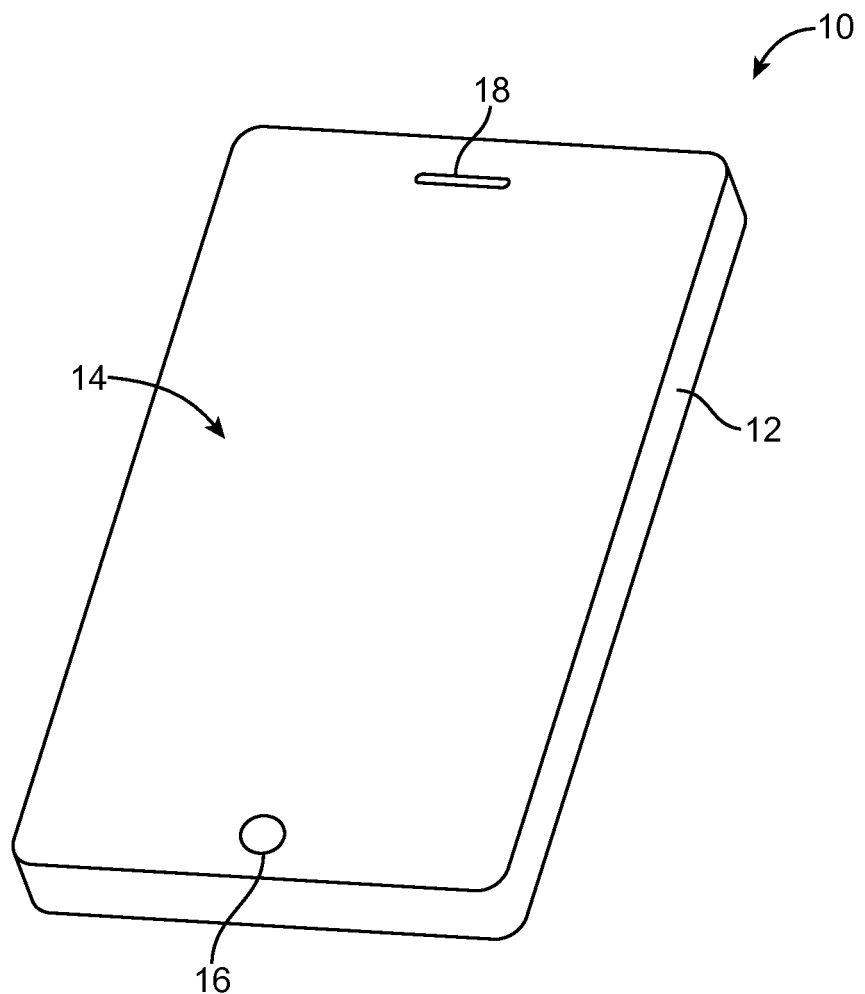
FIG. 1 is a perspective view of an illustrative electronic device of the type that may be provided with electrical component mounting structures in accordance with an embodiment.

An illustrative electronic device that may be provided with component mounting structures and electrical components is shown in FIG. 1. Electronic devices such as device 10 of FIG. 1 may be cellular telephones, media players, other handheld portable devices, somewhat smaller portable devices such as wrist-watch devices, pendant devices, or other wearable or miniature devices, gaming equipment, tablet computers, notebook computers, desktop computers, televisions, computer monitors, computers integrated into computer displays, or other electronic equipment.

In the example of FIG. 1, device 10 includes a display such as display 14. Display 14 has been mounted in a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 may include an array of display pixels formed from liquid crystal display (LCD) components, an array of electrophoretic display pixels, an array of plasma display pixels, an array of organic light-emitting diode display pixels, an array of electrowetting display pixels, or display pixels based on other display technologies. The brightness of display 14 may be adjustable. For example, display 14 may include a backlight unit formed from a light source such as a lamp or light-emitting diodes that can be used to increase or decrease display backlight levels and thereby adjust display brightness. Display 14 may also include organic light-emitting diode pixels or other pixels with adjustable intensities. In this type of display, display brightness can be adjusted by adjusting the intensities of drive signals used to control individual display pixels.

Display 14 may be protected using a display cover layer such as a layer of transparent glass or clear plastic. Openings may be formed in the display cover layer. For example, an opening may be formed in the display cover layer to accommodate a button such as button 16. An opening may also be formed in the display cover layer to accommodate ports such as speaker port 18.

In the center of display 14, display 14 may contain an array of active display pixels. This region is sometimes referred to as the active area of the display. A rectangular ring-shaped region surrounding the periphery of the active display region may not contain any active display pixels and may therefore sometimes be referred to as the inactive area of the display. The display cover layer or other display layers in display 14 may be provided with an opaque masking layer in the inactive region to hide internal components from view by a user.

Figure 2:
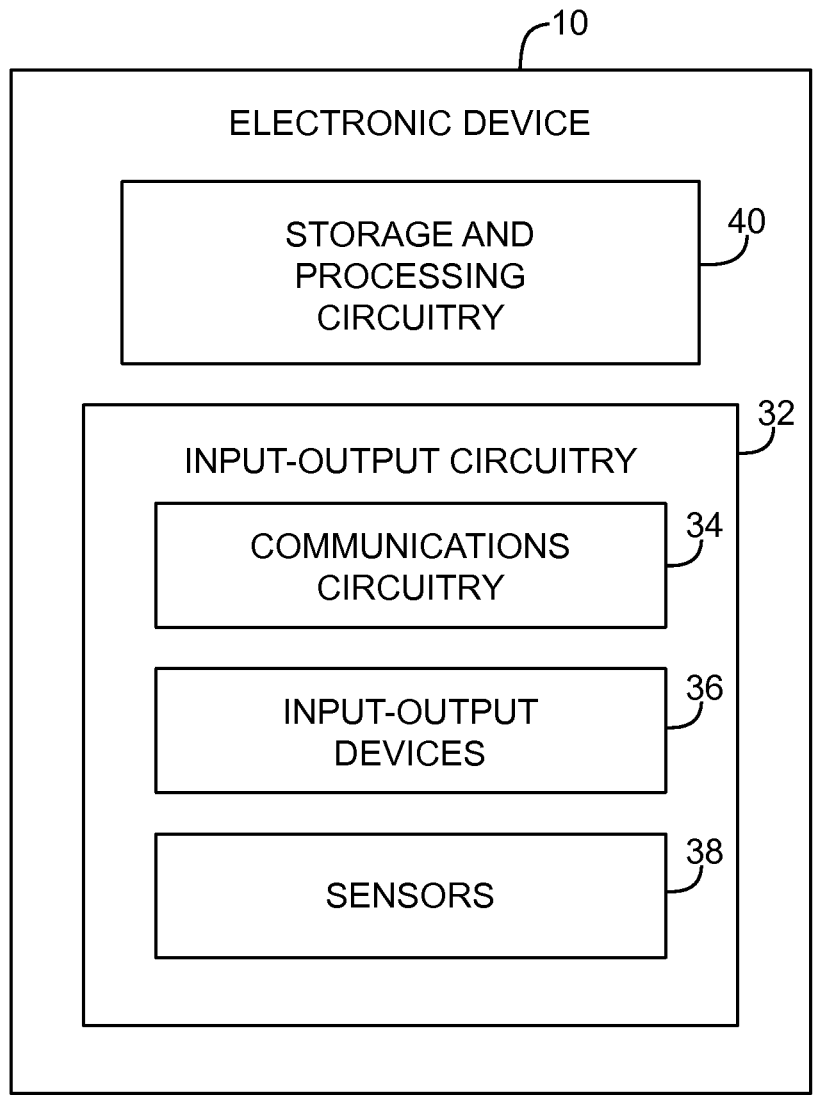
FIG. 2 is a schematic view of an illustrative electronic device of the type that may be provided with electrical components and mounting structures for electrical components in accordance with an embodiment.

A schematic diagram of device 10 is shown in FIG. 2. As shown in FIG. 2, electronic device 10 may include control circuitry such as storage and processing circuitry 40. Storage and processing circuitry 40 may include one or more different types of storage such as hard disk drive storage, nonvolatile memory (e.g., flash memory or other electrically-programmable-read-only memory), volatile memory (e.g., static or dynamic random-access-memory), etc. Processing circuitry in storage and processing circuitry 40 may be used in controlling the operation of device 10. The processing circuitry may be based on a processor such as a microprocessor and other suitable integrated circuits. With one suitable arrangement, storage and processing circuitry 40 may be used to run software on device 10 such as internet browsing applications, email applications, media playback applications, operating system functions, software for capturing and processing images, software implementing functions associated with gathering and processing sensor data, software that makes adjustments to display brightness and touch sensor functionality, etc.

Input-output circuitry 32 may be used to allow input to be supplied to device 10 from a user or external devices and to allow output to be provided from device 10 to the user or external devices.

Input-output circuitry 32 may include wired and wireless communications circuitry 34. Communications circuitry 34 may include radio-frequency (RF) transceiver circuitry formed from one or more integrated circuits, power amplifier circuitry, low-noise input amplifiers, passive RF components, one or more antennas, and other circuitry for handling RF wireless signals. Wireless signals can also be sent using light (e.g., using infrared communications).

Input-output circuitry 32 may include input-output devices 36 such as button 16 of FIG. 1, joysticks, click wheels, scrolling wheels, a touch screen such as display 14 of FIG. 1, other touch sensors such as track pads or touch-sensor-based buttons, vibrators, audio components such as microphones and speakers, image capture devices such as a camera module having an image sensor and a corresponding lens system, keyboards, status-indicator lights, tone generators, key pads, and other equipment for gathering input from a user or other external source and/or generating output for a user.

Sensor circuitry such as sensors 38 of FIG. 2 may include an ambient light sensor for gathering information on ambient light levels, proximity sensor components (e.g., light-based proximity sensors and/or proximity sensors based on other structures), accelerometers, gyroscopes, magnetic sensors, and other sensor structures.

Figure 3:
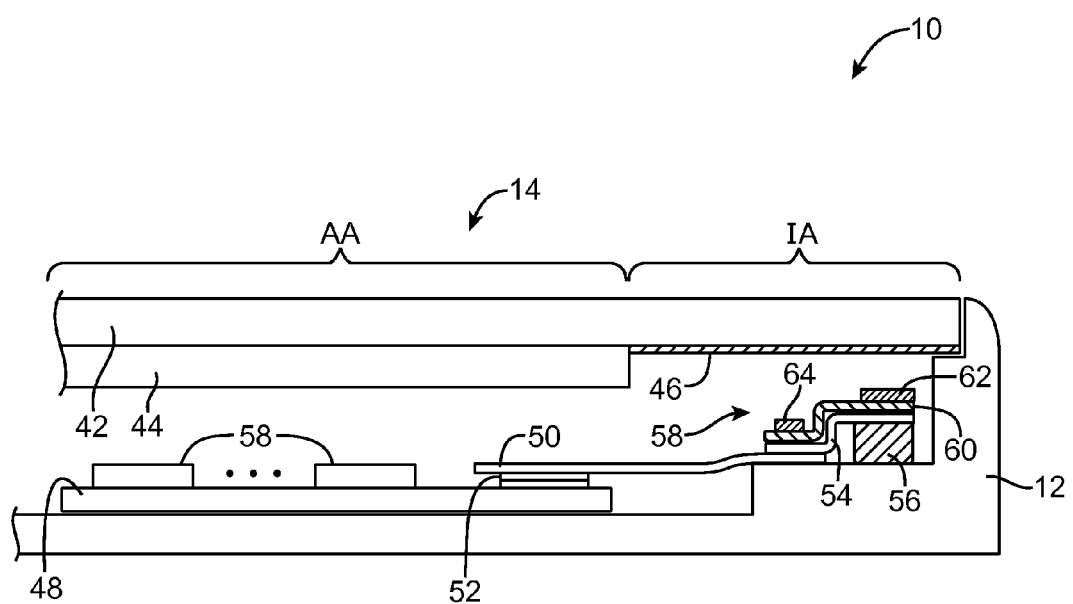
FIG. 3 is a cross-sectional side view of a portion of an electronic device having electrical components and electrical component mounting structures in accordance with an embodiment.

A cross-sectional side view of electronic device 10 is shown in FIG. 3. As shown in FIG. 3, display 14 may be mounted in housing 12. Display structures 44 such as a liquid crystal display module, an organic light-emitting diode display layer, or other display structures that include an array of active display pixels may be formed under active area AA of display cover layer 42. Display cover layer 42 may be formed from a clear glass layer, a layer of transparent plastic, or other cover layer material. A layer of ink (e.g., black ink or white ink or ink of other colors) such as opaque masking layer 46 may be formed on the underside of display cover layer 42 in inactive area IA.

Device 10 may contain one or more substrates such as substrate 48. Substrate 48 may be a dielectric carrier such as a molded plastic carrier or may be a printed circuit. For example, substrates 48 may be a printed circuit such as a rigid printed circuit board formed from a dielectric material such as fiberglass-filled epoxy or may be a flexible printed circuit formed from a dielectric layer such as a sheet of polyimide or other flexible polymer layer. Metal interconnect paths may be provided on substrate 48 to allow substrate 48 to covey signals between components.

Substrate 48 may be coupled to additional substrates in device 10 such as printed circuit 50 using connectors such as connector 52 (e.g., a board-to-board connector or other connection structures). Substrates such as substrate 50 may, in turn, be coupled to additional substrates such as substrate 54. In general, there may be any suitable number of substrates within device 10 (e.g., one or more substrates, two or more substrates, three or more substrates, ten or more substrates, etc.).

With one illustrative configuration, which may sometimes be described herein as an example, substrate 50 is a flexible printed circuit substrate and substrate 54 is a flexible printed circuit substrate. Substrate 54 may be relatively short section of material that is used in forming an electrical path between substrate 50 and electrical component 56. Substrates such as substrate 54 may have signal paths that are coupled to contacts at opposing ends and may therefore sometimes be referred to as jumper substrates or jumpers.

Electrical components such as components 58 and 56 may be electrically connected to conductive paths in substrates such as substrates 48, 50, and 54. The conductive printed circuit paths in substrates 48, 50, and 54 may sometimes referred to as lines, traces, or interconnects and may be formed from conductive materials such as metal (e.g., copper, gold, aluminum, etc.). Using these printed circuit paths, components 58 may be interconnected with each other and may be interconnected with other components in device 10 such as component 56.

Components 58 and 56 may include integrated circuits, sensors, buttons, connectors, audio components, cameras, and other components in control circuitry 40 and input-output circuitry 32 of FIG. 2. As an illustrative example, component 56 may be a vibrator of the type that can be used to vibrate device 10 and thereby alert a user of device 10 in response to receiving an incoming telephone call or other event.

Mounting structures 58 are used to secure component 56 to device housing 12. In the illustrative configuration of FIG. 3, mounting structures 58 include jumper 54, mounting member 60, and fasteners 62 and 64.

Mounting member 60 is formed from metal, plastic, or other materials. With one suitable arrangement, mounting member 60 is a bracket formed from a bent metal structure. The bent metal structure can be provided with one or more openings such as screw holes. Fasteners 62 and 64 may be screws with threaded shafts that pass through the screw holes in mounting member 60. Housing 12 may have threaded openings into which the threaded shafts of screws 62 and 64 are screwed, thereby holding bracket 60 against printed circuit jumper 54 and pressing printed circuit jumper 54 against component 56 and printed circuit 50.

The downwards force exerted by bracket 60 and screws 62 and 64 may help attach component 56 to housing 12. Flexible printed circuit jumper 60 may have opposing ends. Contacts at one end of jumper 60 may mate with corresponding contacts in component 56 such as terminals on a vibrator or other electrical component. Contacts at the other end of jumper 60 may mate with corresponding contacts in flexible printed circuit 50. The force that is created by bracket 60 and screws 62 and 64 may help electrically couple the contacts in jumper 60 to component 56 and to printed circuit substrate 50.

Figure 4:
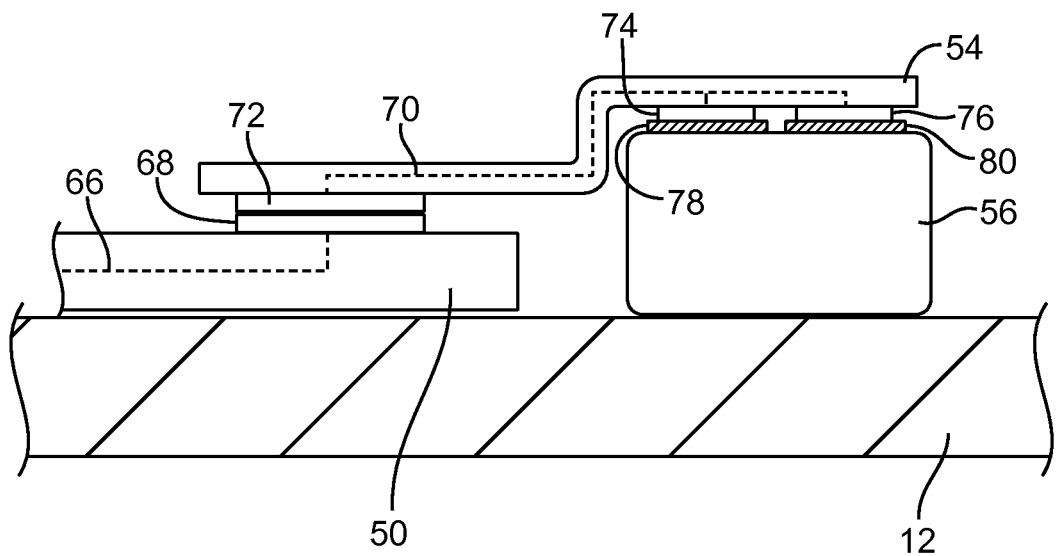
FIG. 4 is a cross-sectional side view of an electrical component such as a vibrator that has been mounted within an electronic device housing using electrical component mounting structures in accordance with an embodiment.

As shown in FIG. 4, printed circuit 50 may have metal lines such as metal traces 66 that are coupled to contacts such as contact 68. Contacts at a first end of flexible printed circuit jumper 60 such as metal contact pad 72 on the left-hand end of jumper 60 in FIG. 4 may mate with contacts such as contact 68. Contacts at an opposing second end of flexible printed circuit jumper 60 such as metal contacts 74 and 76 may mate with corresponding contacts on component 56 such as metal terminals 78 and 80. Metal traces 70 in printed circuit 54 may form signal paths that interconnect contacts 72, 74, and 76. During operation of device 10, signals may be conveyed between component 56 and components 58 using paths such as path 66, contacts such as mating contacts 68 and 72, path 70, and mating contacts such as mating contacts 74 and 78 and mating contacts 76 and 80.

There may be any suitable number of signal lines in paths such as paths 66 and 70. As an example, a pair of positive and negative signal lines in paths 66 and 70 may be used to supply current to terminals 78 and 80 of component 56 that control the operation of component 56 (e.g., a current that powers a vibrator or other component 56). When using metal pads for forming contacts such as contacts 68, 72, 74, and 76, there is no need to use spring structures to form electrical connections for the paths of FIG. 4. Electrical contacts formed from pad-shaped structures may exhibit a lower profile than springs, may exhibit less movement than springs, may be less subject to fatigue as a result of temperature fluctuations than springs, and may avoid issues with spring plating corrosion. Terminals 78 and 80 may be formed using springs, using solid contact pads, or using other conductive contact structures.

Figure 5:
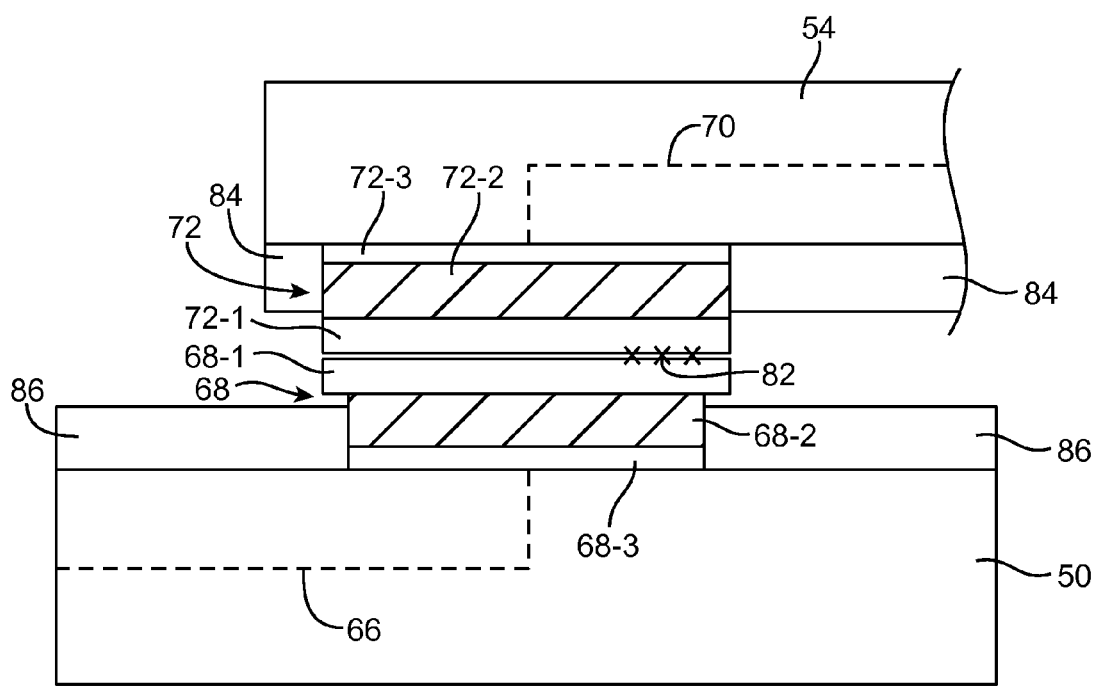
FIG. 5 is a cross-sectional side view of a portion of an electrical interface formed from mating metal contacts in an electrical path that provides signals to an electrical component mounted using mounting structures in accordance with an embodiment.

FIG. 5 is a cross-sectional side view of an illustrative electrical connection of the type that may be formed from mating contacts such as contacts 74 and 78, 76 and 80, or (as shown in the example of FIG. 5), contacts 72 and 68. As shown in FIG. 5, printed circuit 50 may have conductive traces 66 that are coupled to contacts such as contact 68. Contact 68 may be formed in an opening in solder mask 86 on the surface of printed circuit substrate 50. As an example, contact 68 may be formed within a rectangular opening in solder mask 86.

Contact 68 may be formed from conductive structures such as metal trace (pad) 68-3, conductive material such as solder 68-2, and metal pad 68-1. Metal trace 68-3 may have a rectangular shape that fills the rectangular opening in solder mask 86. Solder 68-2 may be used to solder contact pad 68-1 to metal contact trace 68-3. Contact pad 68-1 may be formed from a material such as gold that resists oxidation and therefore forms a good ohmic contact with other structures.

With one suitable arrangement, metal trace 68-3 may be formed from a metal such as copper. The surface of metal trace 68-3 may lie below the surface of solder mask 86. The addition of gold contacts such as contact pad 68-1 to contacts such as contact 68 may help ensure that contact 68 protrudes sufficiently from printed circuit 50 to form satisfactory electrical contact with mating contact 72. Contact 72, which is coupled to metal traces such as trace 70 in printed circuit 54, may be formed from printed circuit traces such as metal contact pad 72-3, solder 72-2, and gold contact pad 72-1 in a rectangular opening in solder mask 84.

Solder mask layers such as solder mask layer 86 and solder mask layer 84 may be formed from a dielectric material such as polyimide or other polymer. Solder mask layers may be formed from screen printed liquid polymer materials, photo-imageable polymer layers, and dry polymer films.

If desired, conductive material such as material 82 may be interposed between contacts 72 and 68 to facilitate formation of a satisfactory low resistance electrical connection. Conductive material 82 may be conductive adhesive such as conductive epoxy, metal paint such as silver paint, solder, or other conductive materials.

Figure 6:
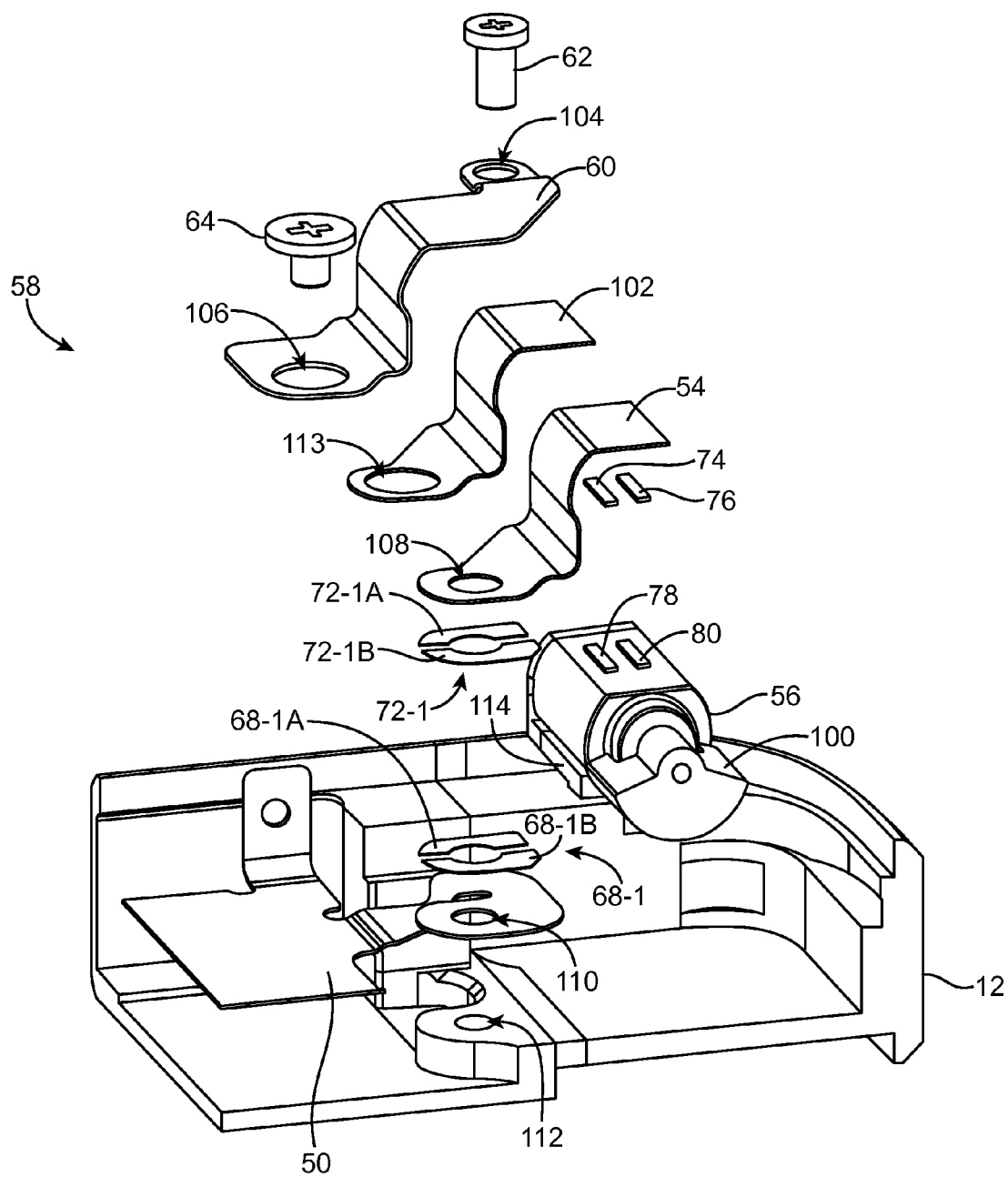
FIG. 6 is an exploded perspective view of electrical component mounting structures being used to mount an electrical component such as a vibrator in a corner of an electronic device housing in an electronic device in accordance with an embodiment.

FIG. 6 is an exploded perspective view of illustrative component mounting structures 58 in a corner of electronic device 10. Component mounting structures 58 may be mounted under an inactive region in display 14 such as region IA in FIG. 3 or may be mounted under an active region in display 14 using as region AA of FIG. 3.

In the illustrative configuration of FIG. 6, printed circuit 50 has an opening such as opening 110 to accommodate the shaft of screw 64 while screw 64 is being screwed into threaded opening 112 of housing 12. Contact structures 68-1 may include first contact 68-1A and second contact 68-1B. Contacts 68-1A and 68-2B are configured to extend around opposing sides of screw 64 when screw 64 is being used to secure bracket 60 to housing 12, so that the pressure exerted by screw 64 bears on contacts 68-1A and 68-1B to help form electrical connections with mating contacts.

Contacts 68-1A and 68-1B may be configured to mate with corresponding contact structures 72-1 such as contact 72-1A and contact 72-1B on printed circuit 54. Printed circuit 54 may also be provided with contact 74 to mate with terminal 78 of component 56 and contact 76 to mate with terminal 80 of component 56.

Component 56 may be a vibrator having an asymmetric (off-axis) weight such as weight 100. Weight 100 may be mounted on one side of a shaft that is rotated by a motor in vibrator 56, thereby producing vibrations in device 10. Support structure 114 may be used to support component 56 when component 56 is being held against housing 12 using bracket 60 and screws 62 and 64. Structure 114 may be formed from plastic, foam, or other suitable material.

Adhesive 102 may be used to help attach metal bracket 60 to flexible printed circuit jumper 54. Adhesive 102 may have an opening such as opening 113 to accommodate screw 64. When structures 58 are assembled, opening 106 may be aligned with openings such as opening 113, opening 108, the openings formed in the center of structures 72-1A and mating structures 68-1A, opening 110, and opening 112. Opening 104 may likewise be aligned with an opening in housing 12 and, if desired, other openings. The openings in mounting structures 58 allow mounting structures 58 to accommodate fasteners such as screws 64 and 62.

Figure 7:
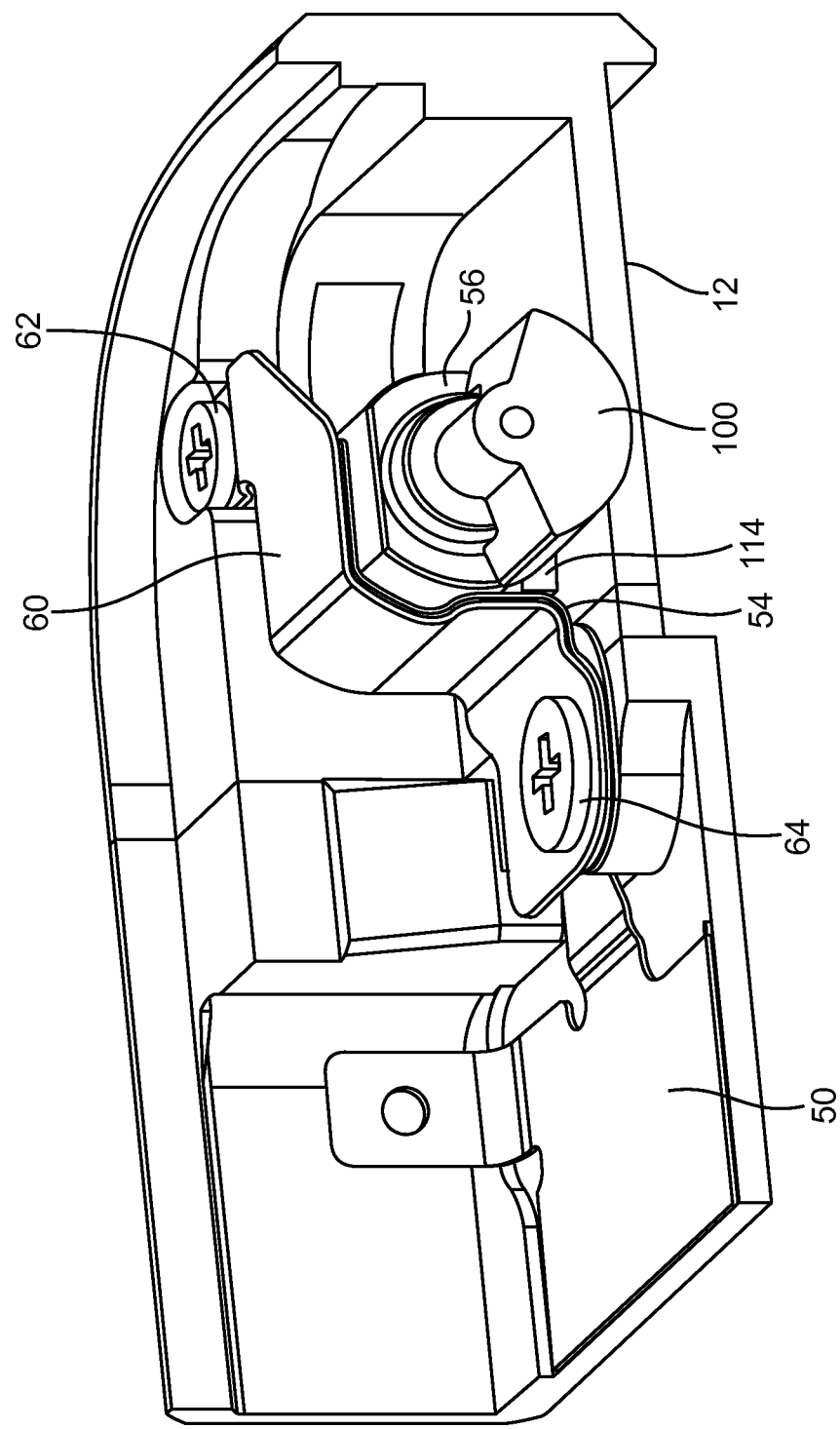
FIG. 7 is a perspective view of the electrical component mounting structures of FIG. 6 following assembly in the corner of the electronic device housing in the electronic device in accordance with an embodiment.

A perspective view of mounting structures 58 of FIG. 6 in an assembled configuration is shown in FIG. 7. As shown in FIG. 7, fasteners such as screws 64 and 62 or other suitable attachment structures may be used in mounting bracket 60 on housing 12. Printed circuit 50 may be used as a flexible signal cable for routing signals between printed circuit 48 and jumper 54. Additional components such as components 58 and 56 may be mounted to printed circuit 50, if desired.

The foregoing is merely illustrative and various modifications can be made by those skilled in the art without departing from the scope and spirit of the described embodiments. The foregoing embodiments may be implemented individually or in any combination.

What is claimed is:

1. Apparatus, comprising:
a mounting bracket;
a flexible printed circuit having a polymer substrate layer, metal traces in the polymer substrate layer, and a metal contact pad; and
an electrical component, wherein the electrical component has an electrical terminal that is electrically connected to the metal contact pad when the mounting bracket presses against the electrical component, wherein the mounting bracket covers the entire flexible printed circuit.

2. The apparatus defined in claim 1 further comprising:
a solder mask layer on the polymer substrate layer, wherein the solder mask layer has an opening and wherein the metal traces in the polymer substrate include a metal trace in the opening.

3. The apparatus defined in claim 2 further comprising solder that solders the metal contact pad to the metal trace in the opening.

4. The apparatus defined in claim 3 further comprising a device housing, wherein the mounting bracket mounts the electrical component to the device housing.

5. The apparatus defined in claim 4 wherein the device housing comprises a metal electronic device housing having an opening and wherein the apparatus further comprises a screw that screws into the opening to mount the mounting bracket and the electrical component to the metal electronic device housing.

6. The apparatus defined in claim 5 wherein the electrical component comprises a vibrator.

7. The apparatus defined in claim 6 wherein the mounting bracket comprises a bent metal member.

8. The apparatus defined in claim 6 wherein the flexible printed circuit comprises a jumper having first and second ends.

9. The apparatus defined in claim 8 wherein the metal contact pad is located at the first end and wherein the apparatus further comprises an additional metal trace, additional solder on the metal trace, and an additional metal contact pad at the second end.

10. The apparatus defined in claim 9 further comprising a printed circuit having at least one contact that presses against the additional metal contact pad on the jumper at the second end.

11. An electronic device, comprising:
a vibrator having terminals;
a housing to which the vibrator is mounted;
a flexible printed circuit having contact pads that directly press against the terminals; and
a bent metal member that is separate from the flexible printed circuit and that is screwed to the housing to press the flexible printed circuit against the vibrator and to press the contact pads against the terminals, wherein the bent metal member has first and second bent regions, wherein the flexible printed circuit has first and second bent regions, and wherein the first and second bent regions of the bent metal member conform to the first and second bent regions of the flexible printed circuit.

12. The electronic device defined in claim 11 wherein the contact pads comprise gold contact pads that directly press against the terminals.

13. The electronic device defined in claim 11 further comprising an additional printed circuit, wherein the additional printed circuit has first contact pads and wherein the flexible printed circuit has second contact pads that mate with the first contact pads.

14. The electronic device defined in claim 13 wherein the flexible printed circuit has opposing first and second ends, wherein the contact pads that directly press against the terminals are located at the first end and wherein the second contact pads are located at the second end.

* * * * *